(12) United States Patent
Chen et al.

(10) Patent No.: US 11,153,963 B2
(45) Date of Patent: Oct. 19, 2021

(54) CIRCUIT CARRIER STRUCTURE AND MANUFACTURING METHOD THEREOF

(71) Applicant: Unimicron Technology Corp., Taoyuan (TW)

(72) Inventors: Chang-Fu Chen, Taoyuan (TW); Ho-Shing Lee, Taoyuan (TW); Chien-Chen Lin, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 16/845,069

(22) Filed: Apr. 10, 2020

(65) Prior Publication Data

US 2021/0289614 A1 Sep. 16, 2021

(30) Foreign Application Priority Data

Mar. 10, 2020 (TW) .................. 109107751

(51) Int. Cl.
*H05K 1/02* (2006.01)
*H05K 3/00* (2006.01)
*H05K 1/11* (2006.01)
*H05K 3/06* (2006.01)
*H05K 3/46* (2006.01)

(52) U.S. Cl.
CPC .......... *H05K 1/0203* (2013.01); *H05K 1/115* (2013.01); *H05K 3/007* (2013.01); *H05K 3/0047* (2013.01); *H05K 3/06* (2013.01); *H05K 3/4682* (2013.01)

(58) Field of Classification Search
CPC ....... H05K 1/0203–021; H05K 1/0201; H05K 3/007
See application file for complete search history.

(56) References Cited

FOREIGN PATENT DOCUMENTS

| TW | I226115 | 1/2005 |
|---|---|---|
| TW | 201019432 | 5/2010 |
| TW | I582902 | 5/2017 |

OTHER PUBLICATIONS

Machine translation of TW 201019432, May 16, 2010 (Year: 2010).*
"Office Action of Taiwan Counterpart Application", dated Sep. 15, 2020, p. 1-p. 5.

* cited by examiner

*Primary Examiner* — Jeremy C Norris
(74) *Attorney, Agent, or Firm* — JCIPRNET

(57) ABSTRACT

A circuit carrier structure includes an inner circuit structure, at least one first circuit layer, and at least one heat dissipating structure. The inner circuit structure has a first surface and a second surface opposite to the first surface. The first circuit layer is disposed on the first surface of the inner circuit structure. The heat dissipating structure is disposed in the first circuit layer. The heat dissipating structure includes a first heat dissipating pattern, a second heat dissipating pattern and an interlayer metal layer. The first heat dissipating pattern is embedded in the corresponding first circuit layer. The second heat dissipating pattern is disposed on the first heat dissipating pattern. The interlayer metal layer is disposed between the first heat dissipating pattern and the second heat dissipating pattern. A manufacturing method of the circuit carrier structure is also provided.

15 Claims, 6 Drawing Sheets

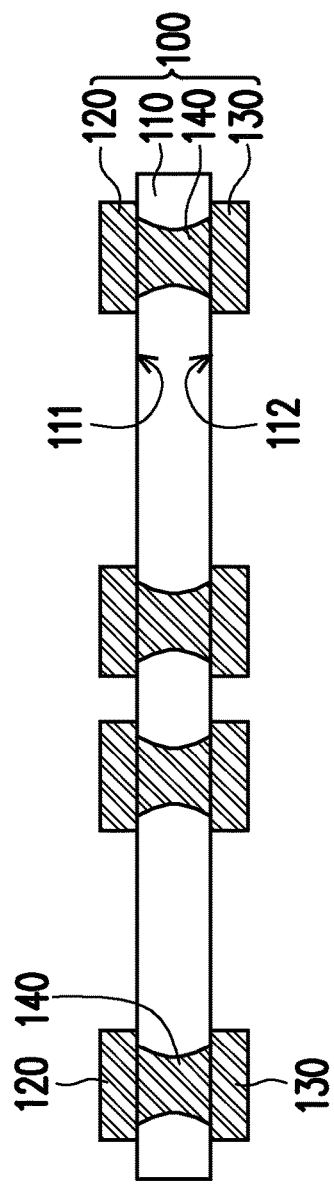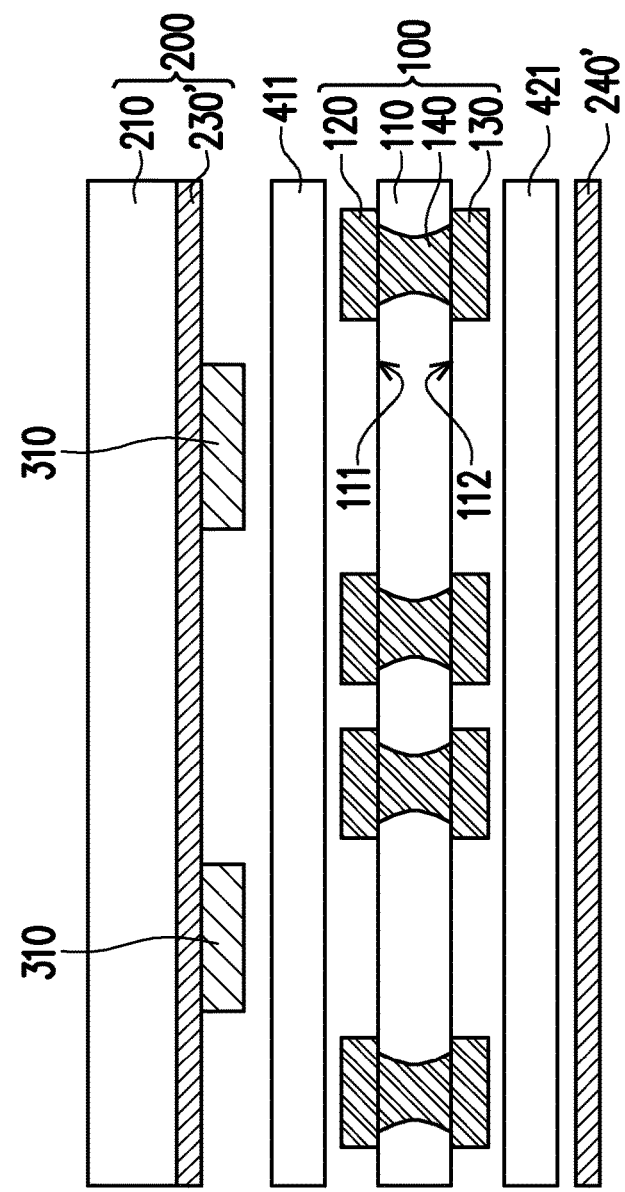

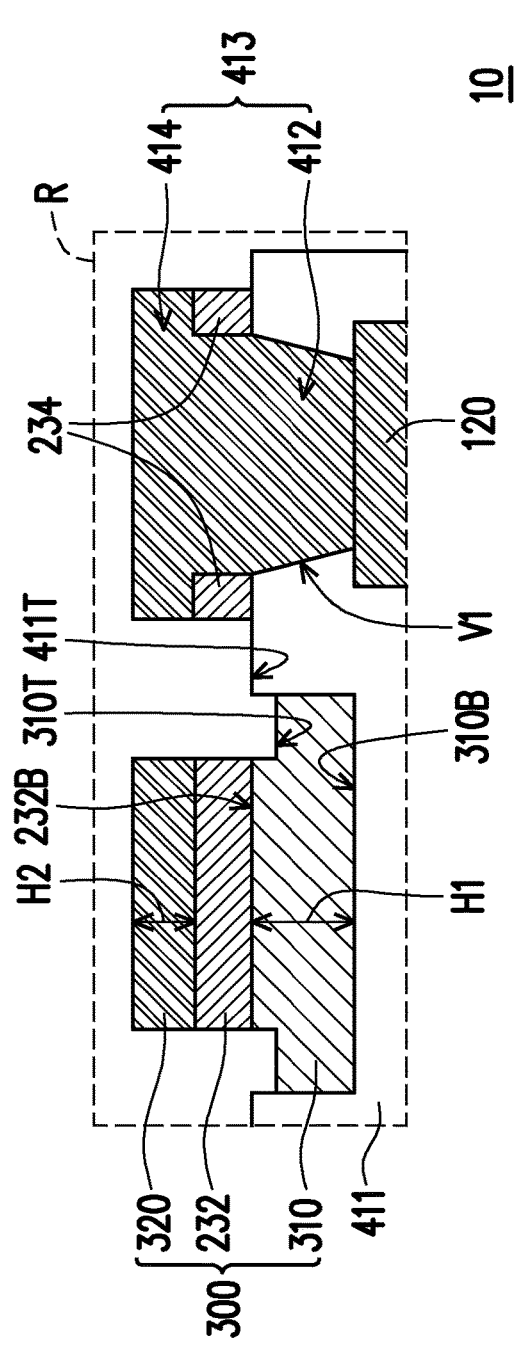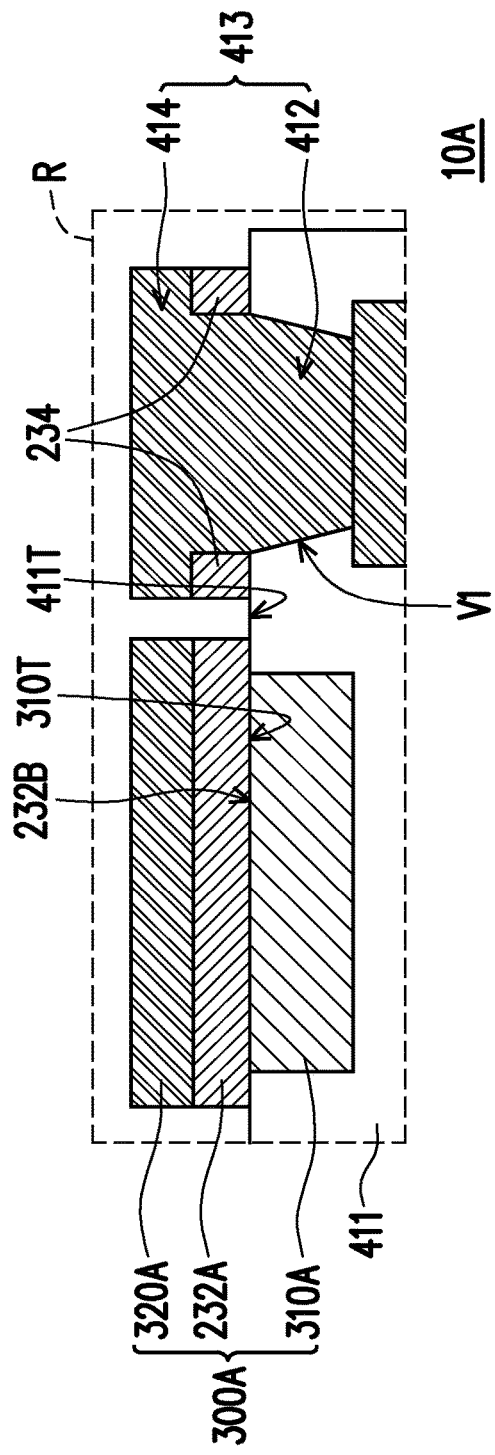

CIRCUIT CARRIER STRUCTURE AND MANUFACTURING METHOD THEREOF

CROSS-REFERENCE TO RELATED APPLICATION

This application claims the priority benefit of Taiwan application serial no. 109107751, filed on Mar. 10, 2020. The entirety of the above-mentioned patent application is hereby incorporated by reference herein and made a part of this specification.

BACKGROUND

Technical Field

The invention relates to a carrier structure and a manufacturing method thereof, and in particular to a circuit carrier structure with a heat dissipating structure and a manufacturing method thereof.

Description of Related Art

At present, for compliance with the trend of thin, light weight, and multi-functioning, the design of circuit substrate of electronic products is often required to integrate several integrated circuit (IC) components in a limited area. In doing so, heat generated by the IC components during operations cannot be dissipated immediately, and a large amount of heat is accumulated in the IC components and the circuit substrate. Thereby, the heat may affect the operation performance of the electronic products. Therefore, how to improve the heat dissipating efficiency of the circuit substrate is an urgent problem in this field.

SUMMARY

The present invention provides a circuit carrier structure, which has good heat dissipating effect.

The present invention provides a manufacturing method of a circuit carrier structure, which has a simple manufacturing process and may reduce costs.

The circuit carrier structure of the present invention includes an inner circuit structure, at least one first circuit layer, and at least one heat dissipating structure. The inner circuit structure has a first surface and a second surface opposite to the first surface. The first circuit layer is disposed on the first surface of the inner circuit structure. The heat dissipating structure is disposed in the first circuit layer. The heat dissipating structure includes a first heat dissipating pattern, a second heat dissipating pattern, and an interlayer metal layer. The first heat dissipating pattern is embedded in the corresponding first circuit layer. The second heat dissipating pattern is disposed on the first heat dissipating pattern. The interlayer metal layer is disposed between the first heat dissipating pattern and the second heat dissipating pattern.

In an embodiment of the present invention, the first circuit layer includes a first dielectric layer and a plurality of first conductive patterns. The first conductive patterns are disposed in the first dielectric layer. The first conductive patterns are electrically connected to the inner circuit structure.

In an embodiment of the present invention, the first circuit layer is plural. The plurality of the first circuit layers are stacked on each other. Wherein, the first conductive patterns of one of the first circuit layers correspondingly electrically connecting to the first conductive patterns of another one of the first circuit layers.

In an embodiment of the present invention, the heat dissipating structure is plural. The plurality of the heat dissipating structures are respectively disposed in different ones of the first circuit layers, and the heat dissipating structures are respectively located on horizontal planes of different heights.

In an embodiment of the present invention, the heat dissipating structure is plural. The plurality of the heat dissipating structures are respectively disposed in the same at least one first circuit layer, and the heat dissipating structures are respectively located on a horizontal plane of the same height.

In an embodiment of the present invention, the circuit carrier structure further includes at least one second circuit layer disposed on the second surface. The second circuit layer includes a second dielectric layer and a plurality of second conductive patterns disposed in the second dielectric layer. The second conductive patterns are electrically connected to the inner circuit structure.

In an embodiment of the present invention, the second heat dissipating pattern is disposed on the interlayer metal layer.

The manufacturing method of the circuit carrier structure of the present invention includes the following steps. Provide a temporary carrier. Form a first metal material layer on the temporary carrier. Form a first heat dissipating pattern on the first metal material layer. Provide an inner circuit structure, and the inner circuit structure has a first surface and a second surface opposite to the first surface. Dispose a first dielectric layer on the first surface. Perform a lamination process to bond the temporary carrier, and the first heat dissipating pattern and the first metal material layer on the temporary carrier to the first surface of the inner circuit structure. The first heat dissipating pattern is embedded in the first dielectric layer. Remove the temporary carrier. Perform a drilling process to form a plurality of first openings in the first dielectric layer. Form a first conductive material layer on the first dielectric layer. The first conductive material layer is disposed in the first openings and covers the first metal material layer. Pattern the first conductive material layer and the first metal material layer to respectively form a second heat dissipating pattern and an interlayer metal layer. The first heat dissipating pattern, the second heat dissipating pattern, and the interlayer metal layer form a heat dissipating structure. The second heat dissipating pattern is disposed corresponding to the first heat dissipating pattern, and the interlayer metal layer is located between the first heat dissipating pattern and the second heat dissipating pattern.

In an embodiment of the present invention, the first openings expose the inner layer circuit structure.

In an embodiment of the present invention, in the step of patterning the first conductive material layer and the first metal material layer, the step further includes forming a plurality of first conductive patterns corresponding to the first openings. The first conductive patterns are electrically connected to the inner circuit structure.

In an embodiment of the present invention, the method further includes disposing a second dielectric layer on the second surface before performing the lamination process.

In an embodiment of the present invention, in the step of the lamination process, the method further includes bonding the first dielectric layer to the first surface of the inner circuit structure, and bonding the second dielectric layer to the second surface of the inner circuit structure. Wherein, the first dielectric layer is located between the first metal material layer and the inner circuit structure.

In an embodiment of the present invention, in the step of performing the drilling process, the method further includes forming a plurality of second openings in the second dielectric layer.

In an embodiment of the present invention, the manufacturing method further includes forming a second conductive material layer on the second dielectric layer. The second conductive material layer is disposed in the second openings.

In an embodiment of the present invention, the manufacturing method further includes patterning the second conductive material layer to form a plurality of second conductive patterns corresponding to the second openings. The second conductive patterns are electrically connected to the inner circuit structure.

Based on the above, since the circuit carrier structure and the manufacturing method thereof according to an embodiment of the present invention may have a plurality of heat dissipating structures disposed in the first circuit layer, a heat dissipating path may be provided and improved. Therefore, the circuit carrier structure has a good heat dissipating effect. In addition, the heat dissipating structure may also increase the volume of the heat dissipating structure through the second heat dissipating pattern. Therefore, the heat dissipating effect of the heat dissipating structure may be further increased, and the heat dissipating efficiency and quality of the circuit carrier structure may be improved. In addition, the manufacturing method of the circuit carrier structure may also simply dispose the heat dissipating structure in the first circuit layer of any layer. Therefore, in addition to providing a better heat dissipating path and increasing the wiring space, the present invention may also simplify the process and reduce costs.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 2A to FIG. 2F are schematic cross-sectional views of a manufacturing process of a circuit carrier structure according to an embodiment of the present invention.

FIG. 3 is a partially enlarged cross-sectional view of the region R of the circuit carrier structure of FIG. 2F.

FIG. 4 is a partially enlarged cross-sectional view of a region R in a circuit carrier structure according to another embodiment of the present invention.

DESCRIPTION OF THE EMBODIMENTS

Some embodiments are provided hereinafter and described in detail with reference to figures. However, the embodiments provided are not intended to limit the scope of the invention. Moreover, the figures are only descriptive and are not drawn to scale. For ease of explanation, the same devices below are provided with the same reference symbols.

Moreover, terms such as "first" and "second" used herein do not represent order, and it should be understood that they are for differentiating devices or operations having the same technical terms.

Secondly, the terms "containing", "including", "having" and the like as used herein are all open-ended terms; i.e., including but not limited to.

Furthermore, the terms "in contact with", "connected to", "bonded to" and the like, as used herein, may mean direct contact or indirect contact via other layers unless otherwise stated.

Figure 1A:
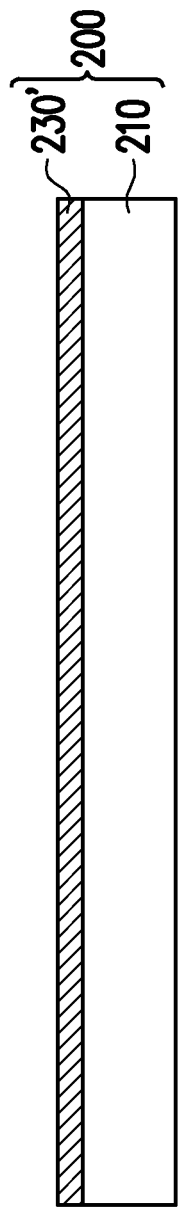
FIG. 1A to FIG. 1B are schematic cross-sectional views illustrating a manufacturing process of a first heat dissipating pattern according to an embodiment of the present invention.
Figure 1B:
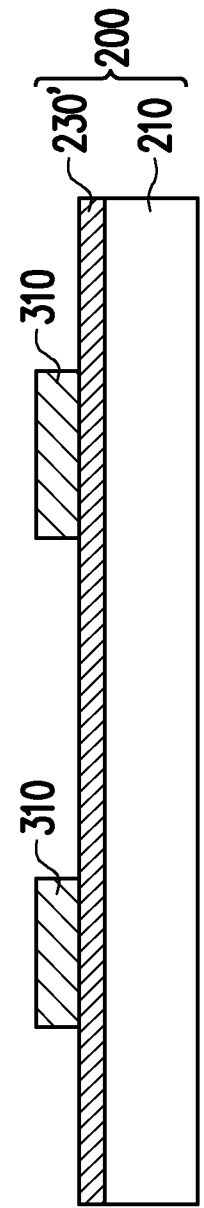

FIG. 1A to FIG. 1B are schematic cross-sectional views illustrating a manufacturing process of a first heat dissipating pattern according to an embodiment of the present invention. FIG. 2A to FIG. 2F are schematic cross-sectional views illustrating a manufacturing process of a circuit carrier structure according to an embodiment of the present invention. It should be noted that the drawings provided are only schematic representations, and are not intended to limit the embodiments of the present invention. Therefore, for clarity of illustrations and convenience of descriptions, some components may be omitted from FIG. 1A to FIG. 2F. Please refer to FIG. 2F first. In the embodiment, the circuit carrier structure 10 includes an inner circuit structure 100, at least one first circuit layer 410, and at least one heat dissipating structure 300. The inner layer circuit structure 100 has a first surface 111 and a second surface 112 opposite to the first surface 111. The first circuit layer 410 is disposed on the first surface 111 of the inner circuit structure 100. The heat dissipating structure 300 is disposed in the first circuit layer 410. The heat dissipating structure 300 includes a first heat dissipating pattern 310, a second heat dissipating pattern 320, and an interlayer metal layer 232. The first heat dissipating pattern 310 is embedded in the corresponding first circuit layer 410. The second heat dissipating pattern 320 is disposed on the first heat dissipating pattern 310. The interlayer metal layer 232 is disposed between the first heat dissipating pattern 310 and the second heat dissipating pattern 320. In the above arrangement, the heat dissipating structure 300 may be disposed in the first circuit layer 410 of any layer, and the heat dissipating structure 300 may absorb the adjacent heat source (for example, the heat generated by the embedded heating element or by the heating element on the surface). In this way, the heat dissipating structure 300 may improve the heat dissipating path on the surface of the multilayered circuit layer or the outermost layer of the multilayered circuit layer. Therefore, the circuit carrier structure 10 has a good heat dissipating effect. In addition, the heat dissipating structure 300 may also increase its volume, as required, when forming circuit patterns. Therefore, the heat dissipating effect of the heat dissipating structure 300 may be further increased. An embodiment will be used to briefly explain the manufacturing process of the circuit carrier structure 10 in the following paragraphs.

Please refer to FIG. 1A and FIG. 1B. FIG. 1A shows a copper foil carrier 200. FIG. 1B shows a copper foil carrier 200 carrying a first heat dissipating pattern 310. Specifically, as shown in FIG. 1A, a temporary carrier 210 is first provided. Next, a first metal material layer 230' is formed on the temporary carrier 210 to constitute a copper foil carrier 200.

In the embodiment, the material of the temporary carrier 210 includes an insulating material, such as a glass fiber substrate, a bismaleimide triazine (BT) resin substrate, a glass fiber epoxy resin copper foil (FR4) substrate, or a substrate of other similar materials.

The material of the first metal material layer 230' includes a metal material, such as copper. In some embodiments, the above mentioned metal material may further include nickel, palladium, gold, silver or an alloy thereof, but the present invention is not limited thereto. The method for forming the first metal material layer 230' includes an electroplating process, an electroless plating process, a coating process, or a screen printing process, but the present invention is not limited thereto.

Please refer to FIG. 1B, a first heat dissipating pattern 310 is formed on the first metal material layer 230'. The first heat dissipating pattern 310 is, for example, a metal block or a patterned metal layer. In the embodiment, the material of the first heat dissipating pattern 310 is, for example, copper. In some embodiments, the above mentioned metal material may further include nickel, palladium, gold, silver or an alloy thereof, but the present invention is not limited thereto. The method for forming the first heat dissipating pattern 310 includes electroplating, electroless plating, or directly disposing a copper block on the first metal material layer 230'. In some embodiments, a layer of copper material may also be deposited first, and then the copper material is patterned through a photolithography process to form copper blocks. It should be noted here, that FIG. 1B only schematically illustrates two of the first heat dissipating patterns 310, but the embodiment is not limited thereto. In some embodiments, the number of the first heat dissipating patterns 310 may be one or more.

Next, please refer to FIG. 2A. The inner circuit structure 100 is provided. The inner circuit structure 100 is, for example, a double-sided circuit substrate, and includes a core layer 110, a first patterned circuit layer 120, a second patterned circuit layer 130, and a plurality of vias 140. The core layer 110 has a first surface 111 and a second surface 112 opposite to the first surface 111 (which may be considered as the first surface 111 and the second surface 112 of the inner circuit structure 100). The first patterned circuit layer 120 is disposed on the first surface 111. The second patterned circuit layer 130 is disposed on the second surface 112. The vias 140 are disposed in the core layer 110, and the vias 140 are electrically connected to the first patterned circuit layer 120 and the second patterned circuit layer 130. In this embodiment, the material of the core layer 110 is, for example, an insulating material, and the material is, for example, a prepreg (PP), an Ajinomoto Build-up Film (ABF) resin, or a photo-curable dielectric material (for example: photoimageable dielectric (PID), but the invention is not limited thereto. The materials of the first patterned circuit layer 120, the second patterned circuit layer 130, and the plurality of vias 140 are, for example, copper, nickel, palladium, gold, silver, or an alloy thereof.

Next, please refer to FIG. 2B. A first dielectric layer 411 is disposed on the first surface 111. In addition, a second dielectric layer 421 may also be disposed on the second surface 112 at the same time. In the embodiment, the materials of the first dielectric layer 411 and the second dielectric layer 421 are, for example, insulating materials, including PP or ABF resin, but the invention is not limited thereto.

Then, the copper foil carrier 200 and the first heat dissipating pattern 310 provided on the copper foil carrier 200 are disposed on the first dielectric layer 411 as shown in FIG. 1B. In addition, a second metal material layer 240' may also be disposed on the second dielectric layer 421 at the same time. From another perspective, the first dielectric layer 411 is located between the inner circuit structure 100 and the copper foil carrier 200, and the second dielectric layer 421 is located between the inner circuit structure 100 and the second metal material layer 240'.

Figure 2C:
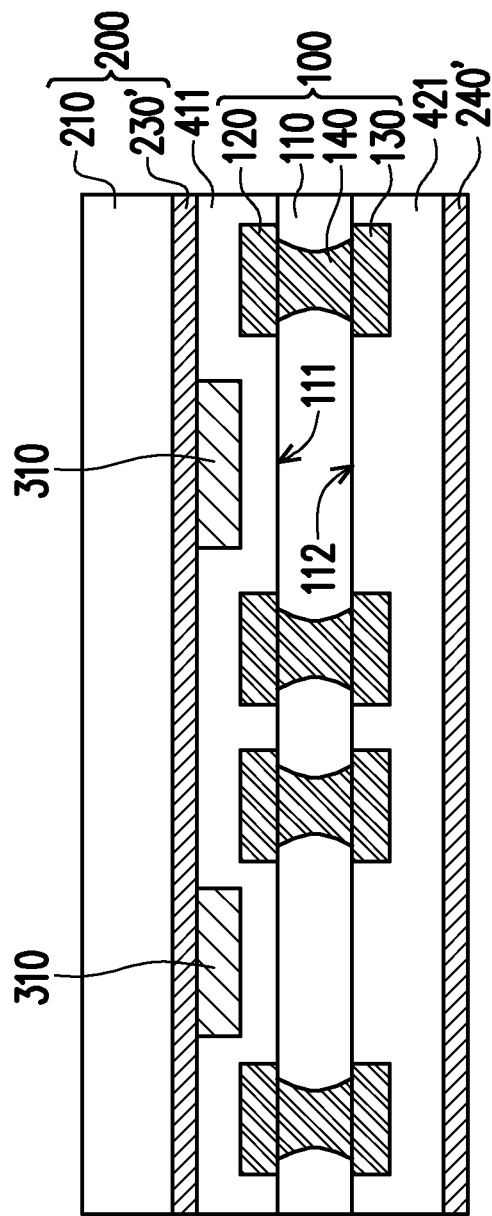

Then, please refer to FIG. 2B and FIG. 2C together, a lamination process is performed to bond the copper foil carrier 200 and the first dielectric layer 411 to the inner circuit structure 100. Specifically, the temporary carrier 210 and the first metal material layer 230', and the first heat dissipating pattern 310 on the temporary carrier 210 may be bonded, for example through heat pressing, to the first surface 111 of the inner circuit structure 100 together with the first dielectric layer 411. During the lamination process, the first heat dissipating pattern 310 may be embedded in the first dielectric layer 411, and the first dielectric layer 411 is located between the first metal material layer 230' and the inner circuit structure 100.

In the above mentioned lamination process, the second metal material layer 240' may also be bonded to the second surface 112 of the inner circuit structure 100 together with the second dielectric layer 421 through heat pressing at the same time. The second dielectric layer 421 is located between the second metal material layer 240' and the inner circuit structure 100. Under the above configuration, the process of building-up layers may be carried out through the simple laminating process. In addition, the disposing of the first heat dissipating pattern 310 may also be simply performed in the process of the building-up of any layer to provide the effect of heat dissipating. Therefore, the manufacturing method of the embodiment has the excellent effect of simple manufacturing process and reduced cost. In addition, it is also possible to simply carry out the process of building-up the layers on the opposite sides of the inner circuit structure 100 at the same time. Thus, further simplifying the manufacturing process and reducing the cost of the circuit carrier structure 10.

Figure 2D:
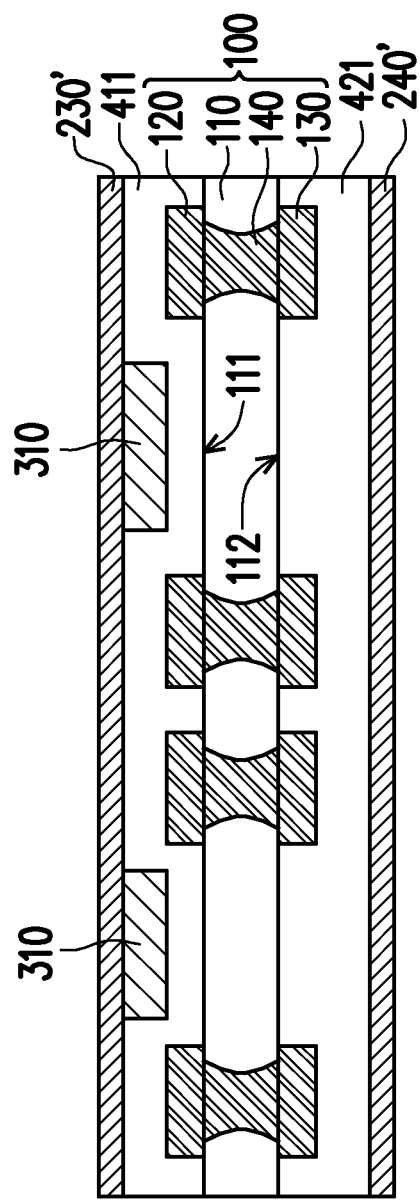

Then, please refer to both FIG. 2C and FIG. 2D together, the temporary carrier 210 is removed.

Figure 2E:
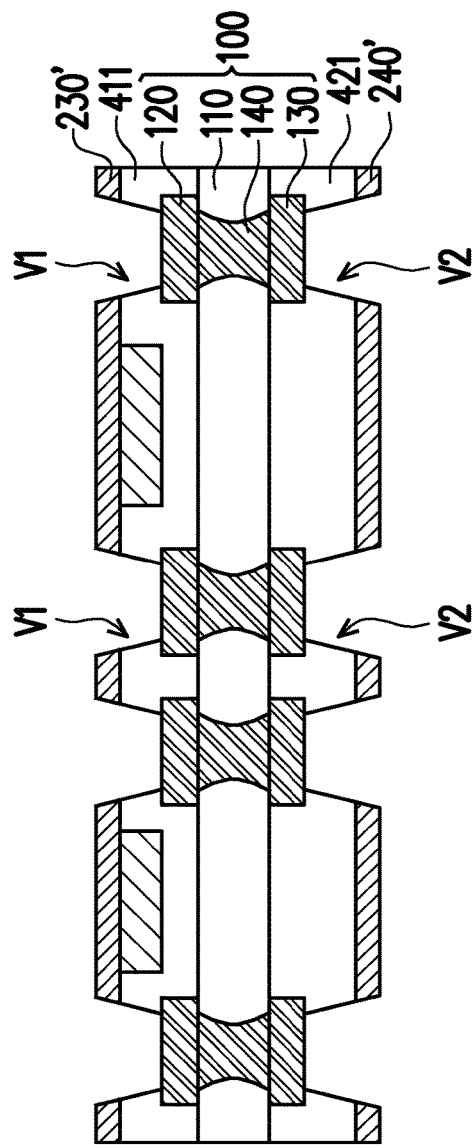

Next, referring to FIG. 2E, a drilling process is performed to form a plurality of first openings V1 in the first dielectric layer 411. In the embodiment, the drilling process includes, for example, laser drilling, but is not limited thereto. In detail, the first metal material layer 230' and the first dielectric layer 411 may be simultaneously drilled by a laser drilling device (not shown), so as to form the plurality of the first openings V1 corresponding to the position of the first patterned circuit layer 120. Therefore, the first openings V1 may expose the first patterned circuit layer 120 of the inner circuit structure 100. FIG. 2E shows that four first openings V1 respectively corresponding to the first patterned circuit layer 120, but the embodiment is not limited thereto. In some embodiments, the number of the first openings V1 may not correspond to the amount of the first patterned circuit layer 120.

In the above mentioned drilling process, a plurality of second openings V2 may also be formed in the second dielectric layer 421 at the same time. In detail, the second metal material layer 240' and the second dielectric layer 421 may be simultaneously drilled by the laser drilling device (not shown), so as to form the plurality of the second openings V2 corresponding to the position of the second patterned circuit layer 130. Therefore, these second openings V2 may expose the second patterned circuit layer 130 of the inner circuit structure 100. FIG. 2E shows that four second openings V2 respectively corresponding to the second patterned circuit layer 130, but the embodiment is not limited thereto.

Figure 2F:
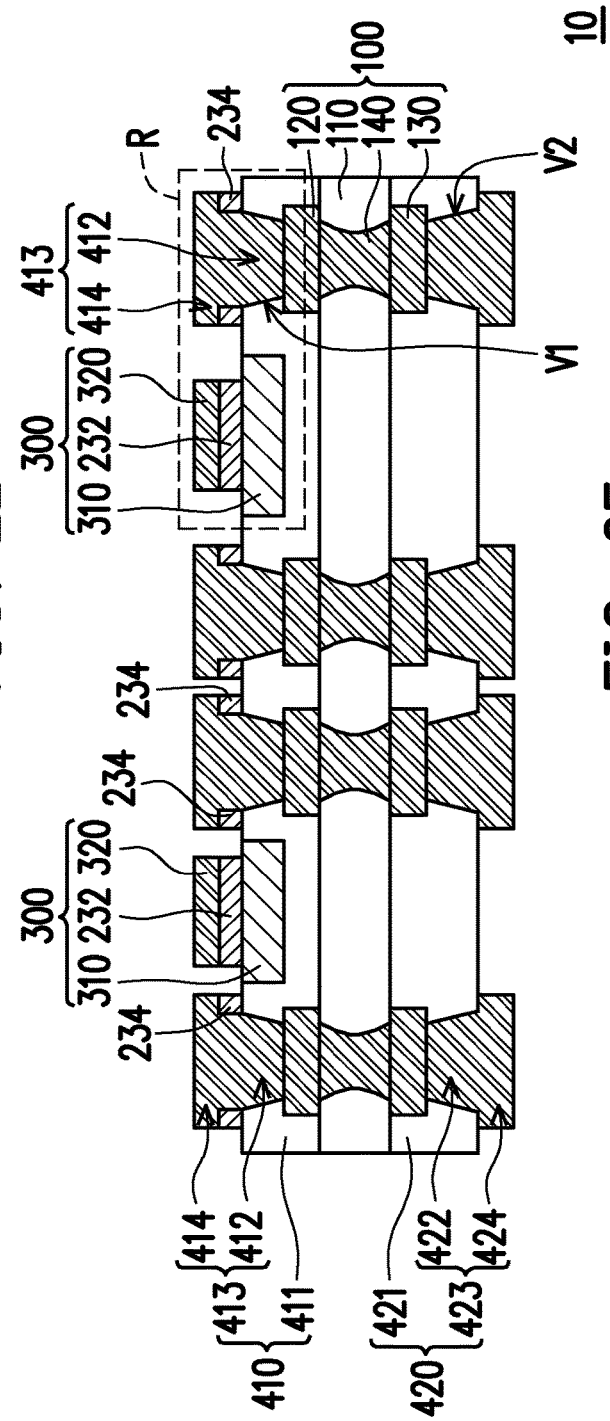

Then, please refer to FIG. 2E and FIG. 2F together, a first conductive material layer (not shown) is formed on the first dielectric layer 411. The first conductive material layer is, for example, disposed on the entire surface of the first dielectric layer 411 and the first metal material layer 230' and the first conductive material layer is disposed in the first opening V1.

In some embodiments, a second conductive material layer (not shown) can also be formed on the second dielectric layer 421, but the invention is not limited thereto.

In addition, in some embodiments, before forming the second conductive material layer, the second metal material layer 240' may be removed, so that the second conductive material layer may directly cover the second dielectric layer 421, and be disposed in the second opening V2, but the invention is not limited thereto. In other embodiments, the second conductive material layer may also cover the second metal material layer 240' and be disposed in the second opening V2.

In this embodiment, the material of the first conductive material layer and the second conductive material layer is, for example, copper. In some embodiments, the above material may further include nickel, palladium, gold, silver or alloys thereof, but the present invention is not limited thereto.

Next, please continue to refer to FIG. 2F, the first conductive material layer (not shown) and the first metal material layer 230' (shown in FIG. 2E) are patterned, so as to pattern the first conductive material layer into the second heat dissipating pattern 320, and to pattern the first metal material layer 230' into an interlayer metal layer 232. Specifically, the first conductive material layer may be etched through a photolithography process to pattern out a plurality of first conductive patterns 413 corresponding to the first openings V1, and a plurality of second heat dissipating pattern 320 corresponding to the first heat dissipating pattern 310. Thus, the first heat dissipating pattern 310, the second heat dissipating pattern 320, and the interlayer metal layer 232 located between the first heat dissipating pattern 310 and the second heat dissipating pattern 320 will constitute the heat dissipating structure 300.

In addition, after the first metal material layer 230' is patterned, a portion of the first dielectric layer 411 and the first heat dissipating pattern 310 may be exposed. In addition, since the patterning of the first metal material layer 230' and the first conductive material layer may be completed in the same step, the manufacturing process may be simplified and costs may be saved. The following paragraphs will describe the patterning process and heat dissipating structure 300 in more details through the enlarged area R in FIG. 2F.

FIG. 3 is a partial enlarged cross-sectional view of region R in the circuit carrier structure of FIG. 2F. Please refer to FIG. 3 and FIG. 2F. The heat dissipating structure 300 and the first circuit layer 410 of the circuit carrier structure 10 may be completed simultaneously in the patterning process. Specifically, when the first conductive material layer and the first metal material layer 230' are removed by an etching solution (not shown), the pattern of the photomask may be transferred to the first conductive material layer and the first metal material. layer 230', so the formed pattern of the second heat dissipating pattern 320 will roughly correspond to the pattern of the interlayer metal layer 232. For example, an outer edge of the interlayer metal layer 232 may correspond to an outer edge of the second heat dissipating pattern 320, but the invention is not limited thereto. In the above configuration, the second heat dissipating pattern 320 is disposed on the interlayer metal layer 232. As shown in FIG. 3, the orthographic projection of the outer edges of the second heat dissipating pattern 320 and the interlayer metal layer 232 on the first dielectric layer 411 will be located within the orthographic projection of the outer edge of the first heat dissipating pattern 310 on the first dielectric layer 411. Since the process using the etching solution will be affected by time, temperature, material thickness and the degree of fineness in patterning, tolerances may occur. Therefore, in order to completely remove a portion of the first metal material layer 230' to form the interlayer metal layer 232, a portion of the first heat dissipating pattern 310 may be removed by the etching solution. In this way, the top surface 310T of the first heat dissipating pattern 310 will not be aligned with the top surface 411T of the first dielectric layer 411. FIG. 2F only schematically shows that under the most optimal conditions, the top of the first heat dissipating pattern 310 may be aligned with the top of the first dielectric layer 411, but the invention is not limited thereto.

In the embodiment, since the etching solution does not affect the interface between the interlayer metal layer 232 and the first heat dissipating pattern 310, the bottom surface 232B of the interlayer metal layer 232 may be substantially aligned with the top surface 411T of the first dielectric layer 411, but the invention not limited thereto.

In the above mentioned configuration, the cross-section of the heat dissipating structure 300 formed by the first heat dissipating pattern 310, the second heat dissipating pattern 320, and the interlayer metal layer 232 may present a stepped inverted T shape, but the invention is not limited thereto.

In the embodiment, a thickness H1 of the first heat dissipating pattern 310 is, for example, 10 µm to 20 µm. A thickness H2 of the second heat dissipating pattern 320 is, for example, 10 µm to 30 µm, but the invention is not limited thereto. In the embodiment, the thickness H1 of the first heat dissipating pattern 310 may be defined as the maximum thickness from the bottom surface 232B of the interlayer metal layer 232 to the bottom surface 310B of the first heat dissipating pattern 310. The thickness H2 of the second heat dissipating pattern 320 may be defined as the maximum thickness from the top surface of the second heat dissipating pattern 320 to the bottom surface of the second heat dissipating pattern 320.

In some embodiments, the volume of the first heat dissipating pattern 310 may be equal to or greater than the volume of the second heat dissipating pattern 320, but the invention is not limited thereto. Thus, the heat dissipating structure 300 may have good heat dissipating efficiency.

As shown in FIG. 2F and FIG. 3, when the first conductive material layer and the first metal material layer 230' are patterned, a first conductive pattern 413 may be simultaneously formed in the first dielectric layer 411. The first conductive pattern 413 may be electrically connected to the first patterned circuit layer 120 of the inner circuit structure 100. In this way, the first dielectric layer 411 and the first conductive pattern 413 may constitute the first circuit layer 410.

In detail, when the first conductive material layer and the first metal material layer 230' are removed with the etching solution (not shown), a portion of the first metal material layer 230' located under the first conductive pattern 413 will not be etched, and metal patterns 234 are formed. The patterns of the metal patterns 234 may be similar to that of the first conductive pattern 413. That is, the outer edge of the pattern of the metal pattern 234 is aligned with the outer edge of the first conductive pattern 413. Further, the first conductive pattern 413 may include a first circuit portion 414 as a pad or a trace, and a first through hole portion 412 disposed in the first opening V1, and to electrically connect the first patterned circuit layer 120. The metal pattern 234 is located between the first circuit portion 414 and the first dielectric layer 411, and the outer edge of the pattern of the metal pattern 234 may be aligned with the outer edge of the first circuit portion 414. In the above configuration, the metal pattern 234 may increase the conductive volume of the first conductive pattern 413, further reducing the resistance, and improving the electrical quality.

Please continue to refer to FIG. 2F. In some embodiments, the second conductive material layer (not shown) may be patterned while the first conductive material layer is patterned, but the present invention is not limited thereto. In the embodiment, when the first conductive patterns 413 are formed, a plurality of second conductive patterns 423 corresponding to the second openings V2 may be formed at the same time. The second conductive patterns 423 are respectively electrically connected to the second patterned circuit layer 130.

In the embodiment, the method of forming the second conductive pattern 423 may be the same as the method of forming the first conductive pattern 413, so it will not be described again. The second conductive pattern 423 may include a second circuit portion 424 as a pad or a trace, and a second through hole portion 422 disposed in the second opening V2, and to electrically connect the second patterned circuit layer 130. In the embodiment, since the second metal material layer 240' may be removed first when the second conductive material layer is formed, the second circuit portion 424 may be directly disposed on the second dielectric layer 421, but the invention is not limited thereto. In some embodiments, since the second conductive material layer may be disposed on the second metal material layer 240', the second metal material layer 240' may also be patterned simultaneously during the step of patterning the second conductive material layer. Thereby, a metal pattern (not shown) is formed between the second circuit portion 424 and the second dielectric layer 421.

In the embodiment, since the second conductive pattern 423 is disposed in the second dielectric layer 421, and the second conductive pattern 423 may be electrically connected to the second patterned circuit layer 130 of the inner circuit structure 100. In this way, the second dielectric layer 421 and the second conductive pattern 423 may constitute the second circuit layer 420. In the above mentioned configuration, the first circuit layer 410 and the second circuit layer 420 are respectively disposed on the first surface 111 and the second surface 112 of the inner circuit structure 100. At this point, the manufacturing process of the circuit carrier structure 10 is completed.

It is worth noting that, since the heat dissipating structures 300 may be disposed on the surface of the outermost layer of the first circuit layer 410, a heat dissipating path may be provided and improved, and the circuit carrier structure 10 has a good heat dissipating effect. For example, the heat dissipating structures 300 may be respectively disposed in the same first circuit layer 410 and located on a horizontal plane of the same height. Therefore, the heat dissipating structure 300 disposed on the outermost surface in FIG. 2F may absorb the thermal energy generated by the adjacent heating element (for example, the heating element 500 shown in FIG. 5) disposed on the outer surface, and may dissipate the thermal energy into the environment.

In addition, the heat dissipating structure 300 may also increase the volume of the heat dissipating structure 300 through the disposing of the second heat dissipating pattern 320 on the first heat dissipating pattern 310. Therefore, the heat dissipating effect of the heat dissipating structure 300 may be further increased, and the heat dissipating efficiency and the quality of the circuit carrier structure 10 may be improved. Furthermore, the manufacturing method of the circuit carrier structure 10 may also simply dispose the first heat dissipating pattern 310 during the process of building-up of any layer. Therefore, in addition to providing a better heat dissipating path and increasing the wiring space, the manufacturing process may also be simplified and reduce costs.

It should be noted that the reference symbols and a part of the contents in the previous embodiment are used in the following embodiments, in which identical reference symbols indicate identical or similar devices. The part of the description with the identical technical content omitted may refer to the foregoing embodiment, which is not repeated in the following description.

FIG. 4 is a partially enlarged cross-sectional view of a region R in a circuit carrier structure according to another embodiment of the present invention. Please refer to FIG. 3 and FIG. 4. The circuit carrier structure 10A of the embodiment is similar to the circuit carrier structure 10 of FIG. 3. The main difference is that in the embodiment, the heat dissipating structure 300A includes a first heat dissipating pattern 310A, a second heat dissipating pattern 320A, and an interlayer metal layer 232A. The orthographic projection of an outer edge of the first heat dissipating pattern 310A on the first dielectric layer 411 will be located within the orthographic projection of an outer edges of the second heat dissipating pattern 320A and the interlayer metal layer 232A on the first dielectric layer 411. That is to say, the interlayer metal layer 232A and the second heat dissipating pattern 320A may completely cover the first heat dissipating pattern 310A, and may cover a portion of the top surface 411T of the first dielectric layer 411. In the embodiment, the top surface 310T of the first heat dissipating pattern 310A and the bottom surface 232B of the interlayer metal layer 232A may be aligned with the top surface 411T of the first dielectric layer 411. In the above configuration, during the process of using an etching solution, the etching solution will not affect the first heat dissipating pattern 310A. In this way, the interlayer metal layer 232A and the second heat dissipating pattern 320A may protect the first heat dissipating pattern 310A. Furthermore, the circuit carrier structure 10A may also obtain the same effect as the above embodiment.

Figure 5:
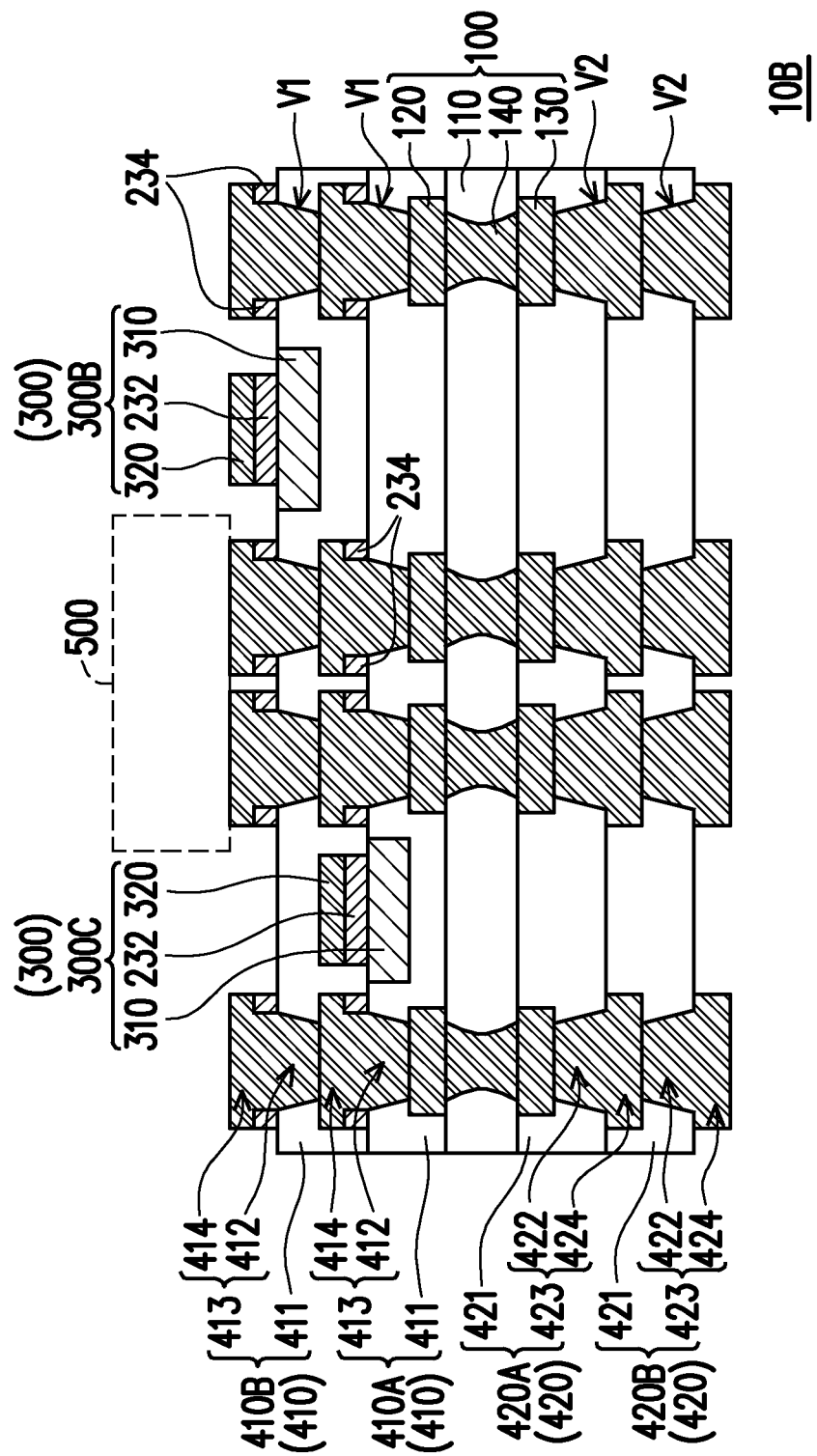
FIG. 5 is a schematic cross-sectional view of a circuit carrier structure according to another embodiment of the present invention.

FIG. 5 is a schematic cross-sectional view of a circuit carrier board structure according to another embodiment of the present invention. Please refer to FIG. 2F and FIG. 5. The circuit carrier structure 10B in the embodiment is similar to the circuit carrier structure 10 in FIG. 2F. The main difference is that in the embodiment, the circuit carrier structure 10B has a multi-layered first circuit layer 410 and a multi-layered second circuit layer 420, and the heat dissipating structures 300 are respectively disposed in different first circuit layers 410. Specifically, the circuit carrier structure 10B includes the plurality of the first circuit layers 410 stacked on each other, and the plurality of the second circuit layers 420 stacked on each other. The structures of the first circuit layer 410 and the second circuit layer 420 are the same as those described in the previous embodiment, so they are not repeatedly described here. It should be noted here that the number of the first circuit layer 410 and the number of the second circuit layer 420 shown in FIG. 5 are only exemplary, and the embodiment is not limited thereto.

As shown in FIG. 5, the circuit carrier structure 10B includes, for example, two first circuit layers 410 stacked on each other. Specifically, the first circuit layer 410A is disposed on the inner circuit structure 100, and the first circuit layer 410B is disposed on the first circuit layer 410A. In this way, the first circuit layer 410A may be located between the first circuit layer 410B and the inner circuit structure 100, and the first circuit layer 410B may be used as the outermost layer of the multi-layered first circuit layer 410.

The first conductive pattern 413 of the first circuit layer 410A is electrically connected to the first patterned circuit layer 120. The first conductive pattern 413 of the first circuit layer 410B is disposed corresponding to the first conductive pattern 413 of the first circuit layer 410A, and the first conductive pattern 413 of the first circuit layer 410A correspondingly electrically connected to the first conductive pattern 413 of the first circuit layer 410B. In the above configuration, the signal of the first patterned circuit layer 120 may be transmitted to the first conductive pattern 413 of the first circuit layer 410B through the first conductive pattern 413 of the first circuit layer 410A.

In the embodiment, the circuit carrier structure 10B further includes two second circuit layers 420 stacked on each other. Specifically, the second circuit layer 420A is disposed on the inner layer circuit structure 100, and the second circuit layer 420B is disposed on the second circuit layer 420A. In this way, the second circuit layer 420A may be located between the second circuit layer 420B and the inner circuit structure 100, and the second circuit layer 420B may be used as the outermost layer of the multi-layered second circuit layer 420.

The second conductive pattern 423 of the second circuit layer 420A is electrically connected to the second patterned circuit layer 130. The second conductive pattern 423 of the second circuit layer 420B is disposed corresponding to the second conductive pattern 423 of the second circuit layer 420A, and the second conductive pattern 423 of the second circuit layer 420A corresponding electrically connected to the second conductive pattern 423 of the second circuit layer 420B. In the above configuration, the signal of the second patterned circuit layer 130 may be transmitted to the second conductive pattern 423 of the second circuit layer 420B through the second conductive pattern 423 of the second circuit layer 420A. In the above mentioned configuration, the circuit carrier structure 10B may be a circuit carrier having two first circuit layers 410 disposed on one side and two second circuit layers 420 disposed on the opposite side. In the embodiment, the second conductive pattern 423 of the outermost second circuit layer 420B may be employed as external pads to connect with other external components, but the invention is not limited thereto. In addition, the first conductive pattern 413 of the outermost first circuit layer 410B may also be employed as pads to couple with a heating element 500 (eg, a chip, an active element, or other element that generates thermal energy), but the invention is not limited thereto. In some embodiments, the heating element 500 may also be disposed between the first circuit layer 410A and the first circuit layer 410B, and is employed as an embedded heating element 500.

It is worth noting that, in the embodiment, the two heat dissipating structures 300 are respectively disposed in two different first circuit layers 410. Specifically, the heat dissipating structure 300C is disposed in the first circuit layer 410A, and is located between the first circuit layer 410A and the first circuit layer 410B. In other words, the heat dissipating structure 300C may be a heat dissipating block embedded between the build-up layers of the circuit structures. In addition, the heat dissipating structure 300B is disposed in the outermost first circuit layer 410B, and is located on the surface of the outermost first circuit layer 410B. As a result, the heat dissipating structure 300C and the heat dissipating structure 300B will be respectively located on horizontal planes of different heights. In the above configuration, the embedded heat dissipating structure 300C may absorb the thermal energy generated by the nearby embedded heating elements (not shown) and provide a path for heat dissipating. In addition, the heat dissipating structure 300B disposed on the outermost surface may absorb the thermal energy generated by the adjacent heating element 500 disposed on the outer surface and dissipate the thermal energy into the environment. In this way, the heat dissipating structure 300C and the heat dissipating structure 300B may provide a variety of better heat dissipating paths, so that the circuit carrier structure 10B has a good heat dissipating effect. In addition, the heat dissipating structure 300 may be simply disposed in any layer of the first circuit layers 410. As a result, manufacturing processes of the circuit carrier structure 10B may be simplified and costs can be reduced.

In some embodiments, the heat dissipating structure 300C and the heat dissipating structure 300B may be respectively disposed in the same first circuit layer 410A or the same second circuit layer 420A, and located on a horizontal plane of the same height. In this way, the circuit carrier structure 10B may obtain the same effect as the above embodiment.

In summary, since the circuit carrier structure according to an embodiment of the present invention may have a plurality of heat dissipating structures disposed in the first circuit layer of the outermost layer, the heat dissipating path may be provided and improved. Therefore, the circuit carrier structure has a good heat dissipating effect. In addition, the heat dissipating structure may also increase the volume of the heat dissipating structure through the second heat dissipating pattern. Therefore, the heat dissipating effect of the heat dissipating structure may be further increased, and the heat dissipating efficiency and quality of the circuit carrier structure may be improved. Furthermore, the manufacturing method of the circuit carrier structure may also simply dispose the heat dissipating structure in the process of building-up any layer. Therefore, in addition to providing a better heat dissipating path and increasing the wiring space, the manufacturing process may also be simplified and the cost reduced.

In addition, since the heat dissipating structures may be disposed in the first circuit layer of any layer, the heat dissipating structures may also absorb the thermal energy emitted by the adjacent heating elements embedded in the first circuit layer or on the surface. In this way, the heat dissipating structures may provide a variety of better heat dissipating paths, so that the circuit carrier structure has a good heat dissipating effect.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. A circuit carrier structure, comprising:
an inner circuit structure having a first surface and a second surface opposite to the first surface;

at least one first circuit layer is disposed on the first surface of the inner circuit structure; and at least one heat dissipating structure is disposed in the at least one first circuit layer, the at least one heat dissipating structure includes:
- a first heat dissipating pattern is embedded in the corresponding at least one first circuit layer;
- a second heat dissipating pattern is disposed on the first heat dissipating pattern; and
- an interlayer metal layer is disposed between the first heat dissipating pattern and the second heat dissipating pattern, wherein an orthographic projection area of the interlayer metal layer on the first surface substantially aligns with an orthographic projection area of the second heat dissipating pattern on the first surface.

2. The circuit carrier structure according to claim 1, wherein each of the first circuit layer comprising:
- a first dielectric layer; and
- a plurality of first conductive patterns are disposed in the first dielectric layer, and the first conductive patterns are electrically connected to the inner circuit structure.

3. The circuit carrier structure according to claim 2, wherein the at least one first circuit layer is plural, the plurality of the first circuit layers are stacked on each other, wherein the first conductive patterns of one of the first circuit layers correspondingly electrically connecting to the first conductive patterns of another one of first circuit layers.

4. The circuit carrier structure according to claim 3, wherein the at least one heat dissipating structure is plural, the plurality of the heat dissipating structures are respectively disposed in different ones of the first circuit layers, and the heat dissipating structures are respectively located on horizontal planes of different heights.

5. The circuit carrier structure according to claim 3, wherein the at least one heat dissipating structure is plural, the plurality of the heat dissipating structures are respectively disposed in the same at least one first circuit layer, and the heat dissipating structures are respectively located on a horizontal plane of the same height.

6. The circuit carrier structure according to claim 1, further comprising at least one second circuit layer disposed on the second surface, each of the second circuit layers comprising:
- a second dielectric layer; and
- a plurality of second conductive patterns are disposed in the second dielectric layer, and the second conductive patterns are electrically connected to the inner circuit structure.

7. The circuit carrier structure according to claim 1, wherein the second heat dissipating pattern is disposed on the interlayer metal layer.

8. A manufacturing method of a circuit carrier structure, comprising:
- providing a temporary carrier;
- forming a first metal material layer on the temporary carrier;
- forming a first heat dissipating pattern on the first metal material layer;
- providing an inner circuit structure, the inner circuit structure having a first surface and a second surface opposite to the first surface;
- disposing a first dielectric layer on the first surface;
- performing a lamination process to bond the temporary carrier, and the first heat dissipating pattern and the first metal material layer on the temporary carrier to the first surface of the inner circuit structure, wherein the first heat dissipating pattern is embedded in the first dielectric layer;
- removing the temporary carrier;
- performing a drilling process to form a plurality of first openings in the first dielectric layer;
- forming a first conductive material layer on the first dielectric layer, the first conductive material layer is disposed in the first openings and covering the first metal material layer; and
- patterning the first conductive material layer and the first metal material layer to respectively form a second heat dissipating pattern and an interlayer metal layer, and the first heat dissipating pattern, the second heat dissipating pattern, and the interlayer metal layer forming a heat dissipating structure, wherein the second heat dissipating pattern is disposed corresponding to the first heat dissipating pattern, and the interlayer metal layer is located between the first heat dissipating pattern and the second heat dissipating pattern, wherein an orthographic projection area of the interlayer metal layer on the first surface substantially aligns with an orthographic projection area of the second heat dissipating pattern on the first surface.

9. The manufacturing method according to claim 8, wherein the first openings expose the inner circuit structure.

10. The manufacturing method according to claim 9, wherein in the step of patterning the first conductive material layer and the first metal material layer, the step further comprising forming a plurality of first conductive patterns corresponding to the first openings, and the first conductive patterns are electrically connected to the inner circuit structure.

11. The manufacturing method according to claim 8, further comprising:
- disposing a second dielectric layer on the second surface before performing the lamination process.

12. The manufacturing method according to claim 11, wherein in the step of the lamination process, the method further comprises bonding the first dielectric layer to the first surface of the inner circuit structure, and bonding the second dielectric layer to the second surface of the inner circuit structure, wherein the first dielectric layer is located between the first metal material layer and the inner circuit structure.

13. The manufacturing method according to claim 11, wherein in the step of performing the drilling process, the method further comprises forming a plurality of second openings in the second dielectric layer.

14. The manufacturing method according to claim 13, further comprising forming a second conductive material layer on the second dielectric layer, and the second conductive material layer is disposed in the second openings.

15. The manufacturing method according to claim 14, further comprising patterning the second conductive material layer to form a plurality of second conductive patterns corresponding to the second openings, and the second conductive patterns are electrically connected to the inner circuit structure.

* * * * *